(12) United States Patent
Adachi

(10) Patent No.: US 11,133,801 B2
(45) Date of Patent: Sep. 28, 2021

(54) OPERATION DEVICE

(71) Applicant: KABUSHIKI KAISHA TOKAI RIKA DENKI SEISAKUSHO, Aichi (JP)

(72) Inventor: Takayuki Adachi, Aichi (JP)

(73) Assignee: KABUSHIKI KAISHA TOKAI RIKA DENKI SEISAKUSHO, Aichi (JP)

( * ) Notice: Subject to any disclaimer, the term of this patent is extended or adjusted under 35 U.S.C. 154(b) by 0 days.

(21) Appl. No.: 16/754,250

(22) PCT Filed: Oct. 22, 2018

(86) PCT No.: PCT/JP2018/039155
§ 371 (c)(1),
(2) Date: Apr. 7, 2020

(87) PCT Pub. No.: WO2019/087839
PCT Pub. Date: May 9, 2019

(65) Prior Publication Data
US 2020/0280314 A1  Sep. 3, 2020

(30) Foreign Application Priority Data
Nov. 6, 2017  (JP) .............................. JP2017-213625

(51) Int. Cl.
*H03K 17/96* (2006.01)
*E05F 15/00* (2015.01)

(52) U.S. Cl.
CPC ......... *H03K 17/9622* (2013.01); *E05F 15/00* (2013.01); *E05Y 2400/854* (2013.01); *E05Y 2900/55* (2013.01); *H03K 2217/960755* (2013.01)

(58) Field of Classification Search
CPC ................. H03K 17/9622; E05F 15/00; E05Y 2400/854; E05Y 2900/55; H01H 3/12; H01H 13/52; B60R 11/0264
USPC ................. 200/600, 339, 341, 343, 315, 553
See application file for complete search history.

(56) References Cited

U.S. PATENT DOCUMENTS

| | | | | |
|---|---|---|---|---|
| 2009/0107829 A1* | 4/2009 | Heimann | ............. | H03K 17/962 200/600 |
| 2009/0114518 A1* | 5/2009 | Lin | ..................... | G06F 3/03547 200/600 |
| 2013/0292239 A1* | 11/2013 | Hahs | ..................... | H03K 17/955 200/600 |

(Continued)

FOREIGN PATENT DOCUMENTS

| | | | |
|---|---|---|---|
| JP | 2005-108621 A | 4/2005 | |
| JP | 2015109212 | * 11/2015 | ............. H01H 23/30 |

*Primary Examiner* — Renee S Luebke
*Assistant Examiner* — Iman Malakooti
(74) *Attorney, Agent, or Firm* — Roberts Calderon Safran & Cole P.C.

(57) ABSTRACT

An operation device includes an operation unit to which a plurality of functions of an operated object are assigned corresponding to a position to be touched by an operation finger, a detection unit that is arranged on at least one plane extended including a plane facing the operation unit to detect the operation finger performing an operation on the operation unit, and a determination unit to determine an instructed function based on a combination of the operation performed on the operation unit and the touch position of the detected operation finger.

10 Claims, 4 Drawing Sheets

(56) References Cited

U.S. PATENT DOCUMENTS

2014/0374232 A1* 12/2014 Hanada ................ H03K 17/962
                                                                                                 200/600

\* cited by examiner

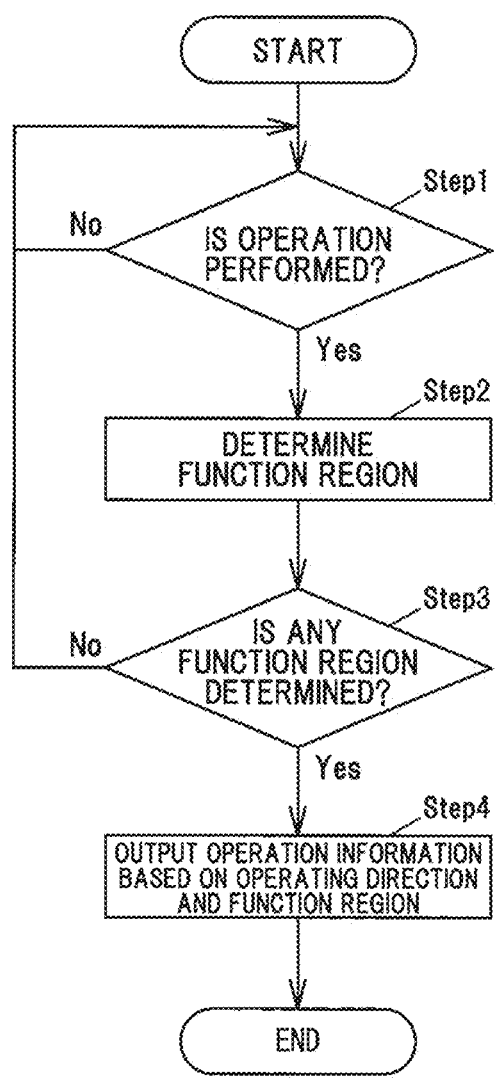

OPERATION DEVICE

CROSS-REFERENCE TO RELATED APPLICATIONS

The present application is a U.S. National Phase of PCT/JP2018/039155 filed on Oct. 22, 2018 claiming priority to Japanese Patent Application No. 2017-213625 filed on Nov. 6, 2017. The disclosure of the PCT Application is hereby incorporated by reference into the present Application.

CROSS-REFERENCES TO RELATED APPLICATIONS

The present patent application claims the priority of Japanese patent application No. 2017/213625 filed on Nov. 6, 2017, and the entire contents of Japanese patent application No. 2017/213625 are hereby incorporated by reference.

TECHNICAL FIELD

The present invention relates to an operation device.

BACKGROUND ART

A power window switch for opening and closing a vehicle window is known (see, e.g., Patent Literature 1).

The power window switch has switch buttons each attached to a switch box via a support shaft so that the front end can swing up and down in the pivotal operation. The switch button is provided with switch portions at the front end and the rear end. The switch portion on the front end is turned on by the pivotal operation to swing the front end in a downward direction, and the switch portion on the rear end is turned on by the pivotal operation to swing the front end in an upward direction.

CITATION LIST

Patent Literature

Patent Literature 1: JP 2005/108621 A

SUMMARY OF INVENTION

Technical Problem

The power window switch disclosed in Patent Literature 1 is configured such that the window opening/closing function is assigned to a single switch button. In order to assign still another function thereto it is necessary to arrange another switch button therewith. However, a problem may arise that the switch increases in size since the width of the switch button cannot be reduced to smaller than the width of an operation finger.

It is an object of the invention to provide an operation device that is configured such that plural functions can be assigned to a single operation unit while suppressing an increase in size.

Solution to Problem

According to an embodiment of the invention, an operation device comprises an operation unit to which a plurality of functions of an operated object are assigned corresponding to a position to be touched by an operation finger, a detection unit that is arranged on at least one plane extended including a plane facing the operation unit to detect the operation finger performing an operation on the operation unit, and a determination unit to determine an instructed function based on a combination of the operation performed on the operation unit and the touch position of the detected operation finger.

Effects of Invention

According to an embodiment of the invention, an operation device can be provided that is configured such that plural functions can be assigned to a single operation unit while suppressing an increase in size.

BRIEF DESCRIPTION OF DRAWINGS

FIG. 4 is a flowchart showing an operation of the operation device in the embodiment.

DESCRIPTION OF EMBODIMENTS

Summary of the Embodiment

An operation device in an embodiment includes an operation unit to which a plurality of functions of an operated object are assigned corresponding to a position to be touched by an operation finger, a detection unit that is arranged on at least one plane extended including a plane facing the operation unit to detect the operation finger performing an operation on the operation unit, and a determination unit to determine an instructed function based on a combination of the operation performed on the operation unit and the touch position of the detected operation finger.

In the operation device, plural functions can be assigned to one operation unit, i.e., it is possible to assign plural functions to one operation unit while suppressing an increase in size as compared to when operation units are aligned.

Embodiment (General Configuration of Operation Device 1)

Figure 1A:
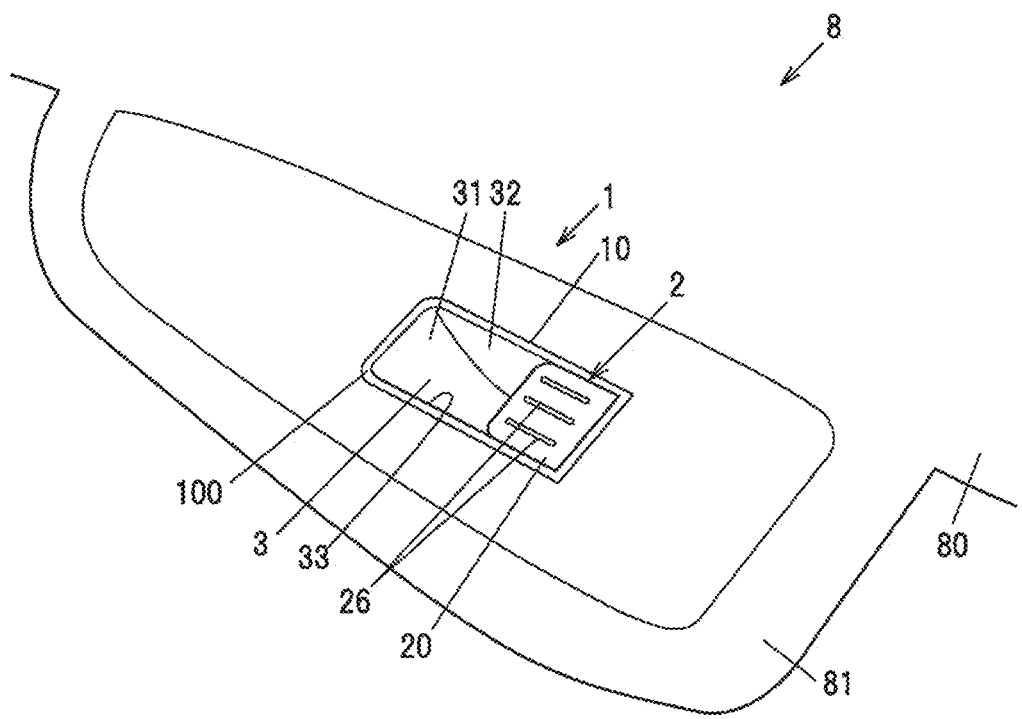
FIG. 1A is an explanatory diagram illustrating an operation device in an embodiment.
Figure 1B:
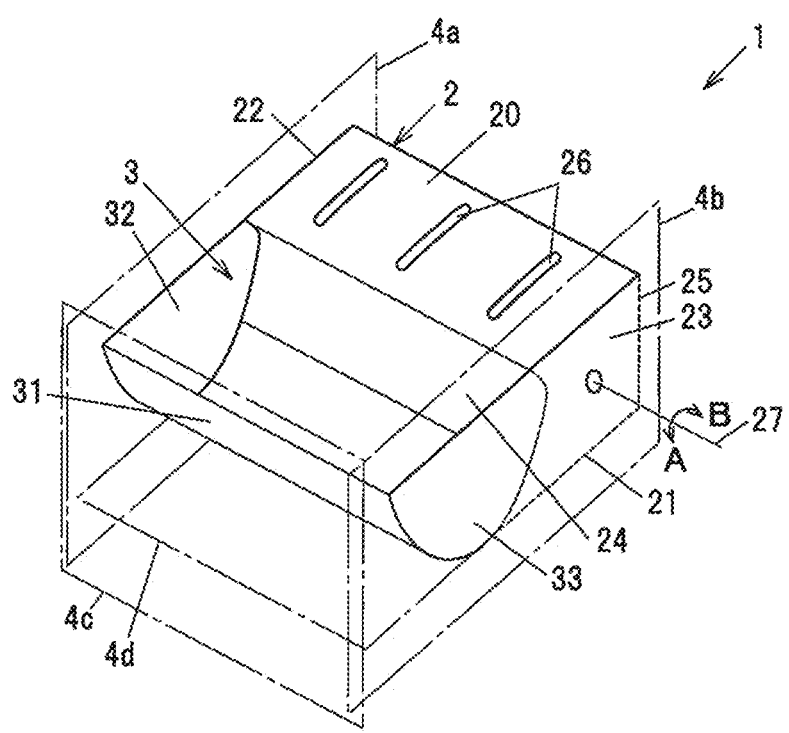
FIG. 1B is an explanatory diagram illustrating imaginary planes on which a detection unit of the operation device is arranged.
Figure 2A:
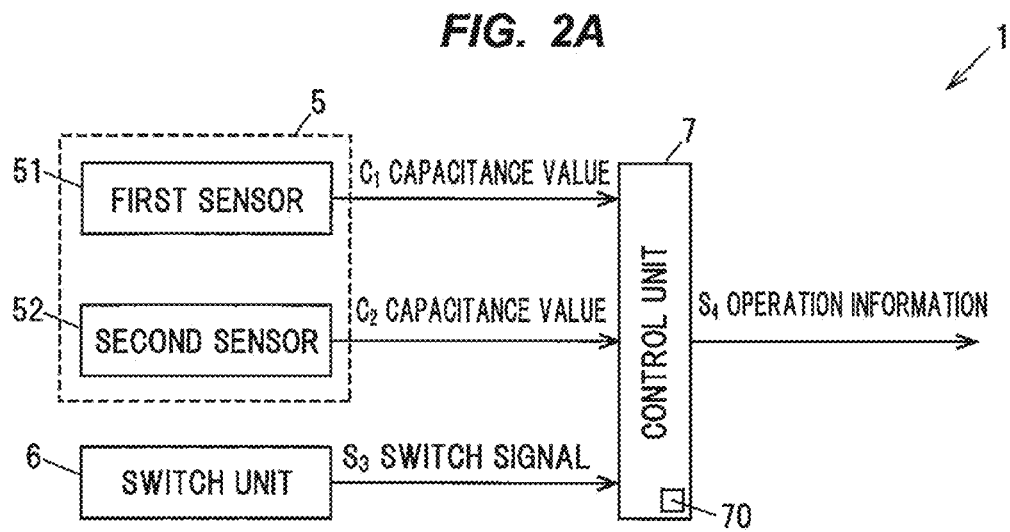
FIG. 2A is a block diagram illustrating the operation device in the embodiment.
Figure 2B:
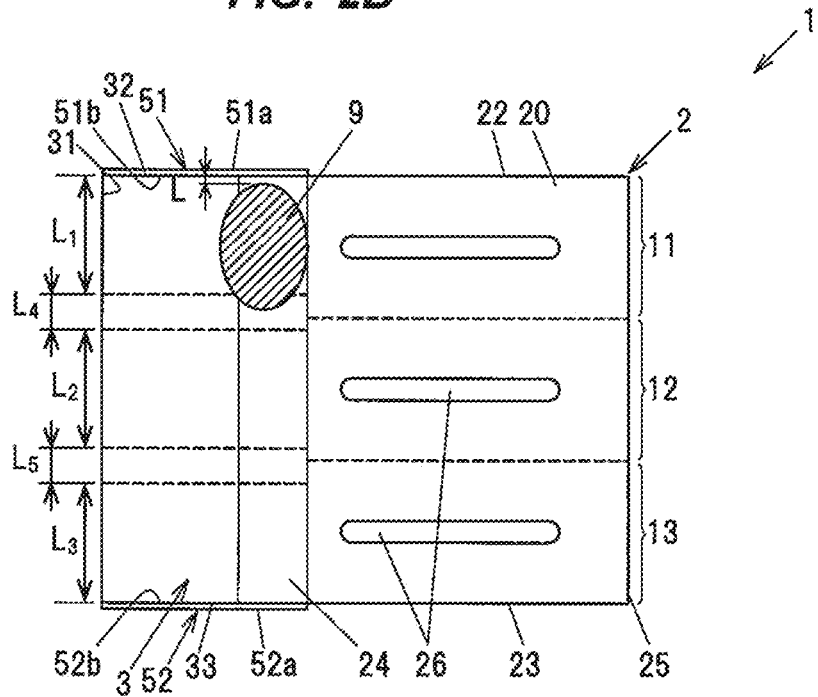
FIG. 2B is an explanatory top view showing a distance between an electrode of the detection unit and an operation finger.

FIG. 1A is an explanatory diagram illustrating an operation device in the embodiment and FIG. 1B is an explanatory diagram illustrating imaginary planes on which a detection unit of the operation device is arranged. FIG. 2A is a block diagram illustrating the operation device in the embodiment and FIG. 2B is an explanatory top view showing a distance between an electrode of the detection unit and an operation finger. In each drawing of the embodiment described below, a scale ratio may be different from an actual ratio. In addition, in FIG. 2A, flows of main signals and information, etc., are indicated by arrows.

As an example, an operation device 1 is arranged on an armrest 81 of a door 80 of a vehicle 8, as shown in FIG. 1A. As an example, the operation device 1 can give an instruction to open/close right and left front windows of the vehicle 8. However, the position of the operation device 1 is not limited thereto. In addition, the operation device 1 is not limited to a device for opening/closing windows, and may be used as an operation device for operating an electronic device. Furthermore, another operation device 1 may be arranged longitudinally adjacent thereto to give an instruction to open/close right and left rear windows.

As shown in FIGS. 1A, 1B, 2A and 2B, the operation device 1 has, e.g., an operation unit 2 to which plural functions of an operated object are assigned so as to correspond to positions to be touched by an operation finger 9, a detection unit 5 which is arranged on at least one plane extended including a plane facing the operation unit 2 and detects the operation finger 9 performing an operation on the operation unit 2, and a control unit 7 as a determination unit which determines an instructed function based on a combination of the operation performed on the operation unit 2 and the touch position of the detected operation finger 9.

The operation device 1 is provided with, e.g., a recessed portion 3 which is located on a side of a front surface 24 of the operation unit 2 and receives the operation finger 9 inserted therein at the time of performing an operation, as shown in FIG. 1B. The at least one plane extended including a plane facing the operation unit 2 is surfaces defining the recessed portion 3, as an example. The surfaces defining the recessed portion 3 in the present embodiment are a surface 31, a side surface 32 and a side surface 33.

The operation unit 2 is configured that, e.g., a push-down operation (an operation in the direction of arrow A) and a pull-up operation (an operation in the direction of arrow B) about a rotational axis 27 can be performed thereon, as shown in FIG. 1B. The detection unit 5 is arranged on a plane extended including a plane intersecting the rotational axis 27. The planes are, e.g., an imaginary plane 4a and an imaginary plane 4b, as shown in FIG. 1B. The imaginary plane 4a and the imaginary plane 4b include the side surface 32 and the side surface 33 of the recessed portion 3, as described above.

The detection unit 5 is provided with a first sensor 51 as a first detection portion and a second sensor 52 as a second detection portion which are arranged on the plane extended including the plane (imaginary planes 4a and 4b) intersecting the rotational axis 27 and face each other.

The operation device 1 is provided with, e.g., a switch unit 6 as an operation detecting portion which detects the push-down operation and the pull-up operation performed on the operation unit 2, as shown in FIG. 2A. The switch unit 6 is a switch which is turned on by the push-down operation or the pull-up operation on the operation unit 2. A switch signal S3, which indicates that the switch is turned on by the push-down operation or the pull-up operation, is output from the switch unit 6 to the control unit 7. Based on the switch signal S3, the control unit 7 determines that the push-down operation or the pull-up operation is performed.

(Configuration of the Operation Unit 2)

The operation unit 2 has, e.g., an elongated shape along the rotational axis 27, as shown in FIGS. 1A and 1B. The operation unit 2 is supported on, e.g., a main body 10 so as to rotate toward the front surface 24 side, i.e., in the direction of arrow A about the rotational axis 27 by the push-down operation and to rotate toward a back surface 25 side, i.e., in the direction of arrow B about the rotational axis 27 by the pull-up operation.

When performing the push-down operation, an operator pushes the front end of the operation unit 2 in the direction of arrow A. Meanwhile, when performing the pull-up operation, the operator inserts the operation finger 9 into the recessed portion 3 to fit in the concave front surface 24 and performs an operation by pulling up the operation unit 2.

Thus, the front surface 24 of the operation unit 2 is formed as a curved surface which allows the operation finger 9 to perform an operation easily. The front surface 24, together with the side surface 32, the side surface 33 and the surface 31, forms the recessed portion 3. The side surface 32 and the side surface 33 are surfaces which face each other. The surface 31 is a curved surface connected to the front surface 24 of the operation unit 2.

The recessed portion 3 in the present embodiment is configured that the surface 31 facing the front surface 24 of the operation unit 2 is a curved surface and is smoothly connected to the front surface 24, hence, the bottom surface is regarded as being included in the surface 31. As a modification, the recessed portion 3 may be configured to have a bottom surface which is not curved.

Three identification raised portions 26 are provided on an upper surface 20 of the operation unit 2. The raised portions 26 are provided as, e.g., guides to identify first to third function regions 11 to 13 shown in FIG. 2B. Alternatively, identification recessed portions may be provided in place of the identification raised portions 26.

The first to third function regions 11 to 13 are regions to which functions of an operated object are assigned. However, the first to third function regions 11 to 13 cannot be pushed down or pulled up separately and are regions simply defined by, e.g., equally dividing the upper surface 20 of the operation unit 2 in a direction intersecting the rotational axis 27.

As an example, the first function region 11 is a region of the operation unit 2 on a side surface 22 side and can give an instruction to open/close the right front window of the vehicle 8. When the push-down operation is performed in this region, the right front window closes. On the other hand, when the pull-up operation is performed, the right front window opens.

As an example, the second function region 12 is a region at the middle of the operation unit 2 and can give an instruction to open/close the right and left front windows. When the push-down operation is performed in this region, the right and left front windows close. On the other hand, when the pull-up operation is performed, the right and left front windows open.

As an example, the third function region 13 is a region of the operation unit 2 on a side surface 23 side and can give an instruction to open/close the left front window of the vehicle 8. When the push-down operation is performed in this region, the left front window closes. On the other hand, when the pull-up operation is performed, the left front window opens.

(Configuration of the Detection Unit 5)

The detection unit 5 is provided with the first sensor 51 and the second sensor 52, as described above. The first sensor 51 and the second sensor 52 are, e.g., capacitive sensors which have an electrode 51a and an electrode 52a as detection electrodes, as shown in FIG. 2B.

The electrode 51a and the electrode 52a are formed of a conductive metal such as copper and have a plate shape. The electrode 51a and the electrode 52a are arranged on the at least one plane extended including a plane facing the operation unit 2. As an example, the at least one plane extended including a plane facing the operation unit 2 is the imaginary plane 4a and the imaginary plane 4b shown in FIG. 2B.

The imaginary plane 4a, the imaginary plane 4b and an imaginary plane 4d (described later) may be either parallel to or non-parallel to the side surface 22, the side surface 23 and a bottom surface 21 of the operation unit 2.

The imaginary plane 4a, is a plane obtained by extending, in another word, expanding a plane facing the side surface 22 of the operation unit 2. The imaginary plane 4a also faces the side surface 32 of the recessed portion 3. The electrode 51a is arranged so that, e.g., a detection plane 51b is located within the imaginary plane 4a.

The imaginary plane 4b is a plane obtained by extending, in another word, expanding a plane facing the side surface 23 of the operation unit 2. The imaginary plane 4b also faces the side surface 33 of the recessed portion 3. The electrode 52a is arranged so that, e.g., a detection plane 52b is located within the imaginary plane 4a.

A capacitance value $C_1$ between the electrode 51a and the operation finger 9 is output as a detection value from the first sensor 51 to the control unit 7. Likewise, a capacitance value $C_2$ between the electrode 52a and the operation finger 9 is output as a detection value from the second sensor 52 to the control unit 7. The capacitance value $C_1$ and the capacitance value $C_2$ are values which decrease as a distance from the electrode increases.

Thus, the capacitance value $C_1$ is higher when the operation finger 9 is closer to the first sensor 51. Likewise, the capacitance value $C_2$ is higher when the operation finger 9 is closer to the second sensor 52. The operation device 1 is configured that the touch position of the operation finger 9 is determined based on the difference between the capacitance value $C_1$ and the capacitance value $C_2$.

(Configuration of the Control Unit 7)

Figure 3A:
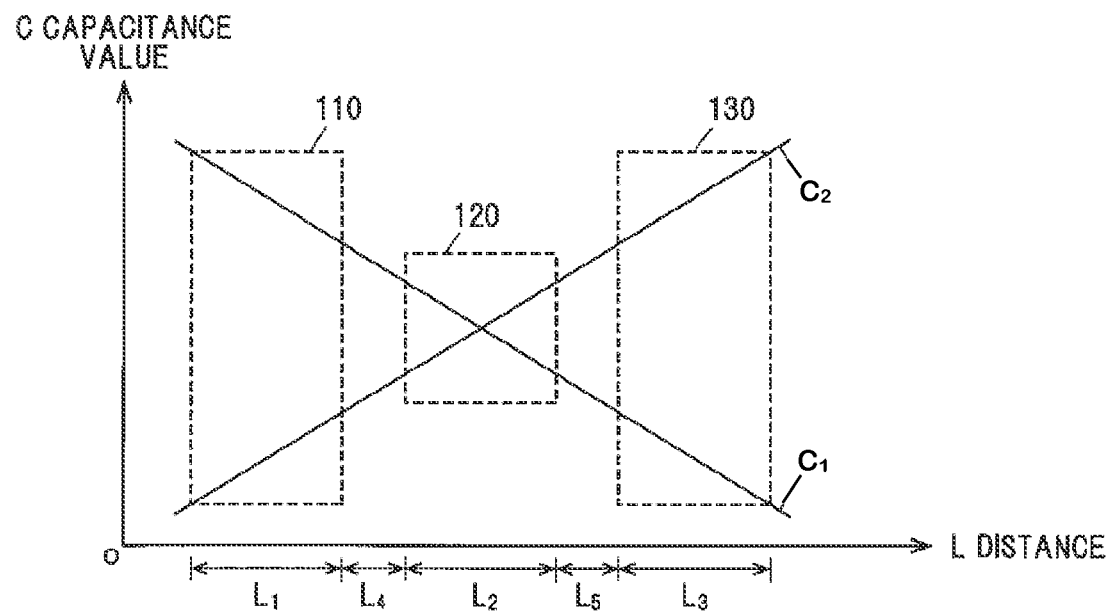
FIG. 3A is a graph showing a relation between a distance L and a capacitance value C of the operation device in the embodiment.
Figure 3B:
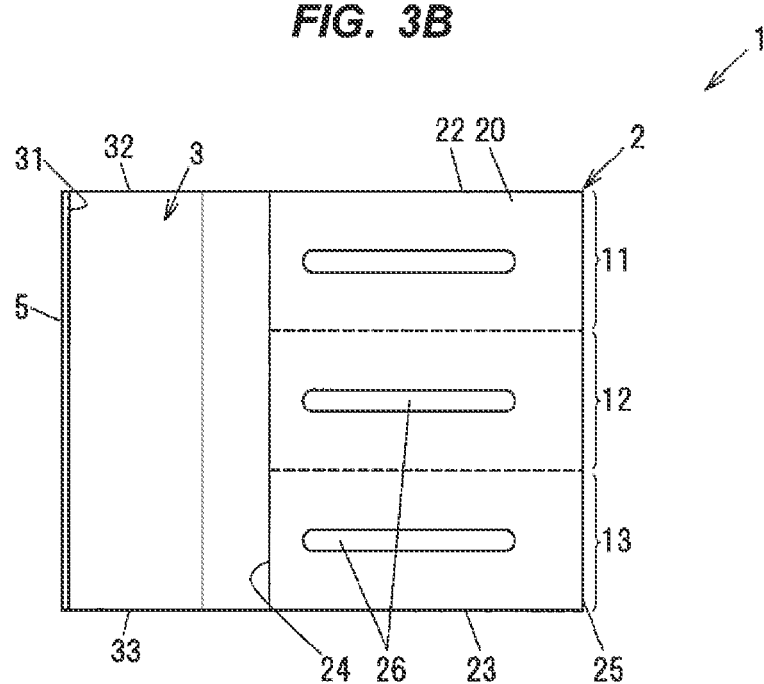
FIG. 3B is an explanatory top view showing the detection unit of the operation device in a modification.

FIG. 3A is a graph showing a relation between the distance L and the capacitance value C of the operation device in the embodiment and FIG. 3B is an explanatory top view showing an example of the detection unit of the operation device in a modification. Although L in FIG. 2B is a distance from the electrode 51a to the operation finger 9 as an example, it is not limited thereto. L may be a distance from the electrode 51a to the center of the width of the operation finger 9.

The control unit 7 is, e.g., a microcomputer composed of a CPU (Central Processing Unit) performing calculation and processing, etc., of the acquired data according to a stored program, and a RAM (Random Access Memory) and a ROM (Read. Only Memory) which are semiconductor memories, etc. The ROM stores, e.g., a program for operation of the control unit 7, and a table 70. The RAM is used as, e.g., a storage area for temporarily storing calculation results, etc.

The control unit 7 determines that, e.g., an instruction to execute the function on the first sensor 51 side of the operation unit 2 is given when the push-down operation or the pull-up operation is detected and also the capacitance value $C_1$ as a detection value of the first sensor 51 is larger than the capacitance value $C_2$ as a detection value of the second sensor 52 as shown in FIG. 3A. The function on the first sensor 51 side is, e.g., a function assigned to the first function region 11 shown in FIG. 2B.

In detail, as an example, the control unit 7 determines that the touch position is located in the first function region 11 and an operation is performed when the push-down operation or the pull-up operation is detected and also the capacitance value $C_1$ is larger than the capacitance value $C_2$ and is within a determination region 110 surrounded by a dotted line in FIG. 3A.

Meanwhile, the control unit 7 determines that an instruction to execute the function on the second sensor 52 side of the operation unit 2 is given when the push-down operation or the pull-up operation is detected and also the capacitance value C2 of the second sensor 52 is larger than the capacitance value $C_1$ of the first sensor 51. The function on the second sensor 52 side is, e.g., a function assigned to the third function region 13 shown in FIG. 2B.

In detail, as an example, the control unit 7 determines that the touch position is located in the third function region 13 and an operation is performed when the push-down operation or the pull-up operation is detected and also the capacitance value $C_2$ is larger than the capacitance value $C_1$ and is within a determination region 130 surrounded by a dotted line in FIG. 3A.

In addition, the control unit 7 determines that an instruction to execute the function assigned to the middle of the operation unit 2 is given when the push-down operation or the pull-up operation is detected and also the capacitance value $C_1$ of the first sensor 51 and the capacitance value $C_2$ of the second sensor 52 are equal within a predetermined acceptable range. The function assigned to the middle of the operation unit 2 is, e.g., a function assigned to the second function region 12 shown in FIG. 2B.

As an example, the predetermined acceptable range is a determination region 120 indicated by a dotted line in FIG. 3A. The control unit 7 judges that, e.g., the capacitance value $C_1$ and the capacitance value $C_2$ are equal when the both values are within the determination region 120.

Thus, the control unit 7 determines that the touch position is located in the second function region 12 and an operation is performed when the push-down operation or the pull-up operation is detected and also the capacitance value $C_1$ and the capacitance value $C_2$ are in the determination region 120.

The determination regions 110 to 130 are, e.g., regions which are preset based on distances from the first sensor 51 and the second sensor 52 to the operation finger 9, as shown in FIG. 29.

As an example, the first to third function regions 11 to 13 are set to smaller than or about the same as the width of the operation finger 9, as shown in FIG. 2B.

The width of the determination region 110 is, e.g., equal to a distance $L_1$, as shown in FIG. 3A. The distance $L_1$ is, e.g., a distance from the electrode 51a and is smaller than the width of the first function region 11, as shown in FIG. 29.

The width of the determination region 120 is, e.g., equal to a distance $L_2$, as shown in FIG. 3A. The distance $L_2$ is, e.g., smaller than the width of the second function region 12, as shown in FIG. 2B.

Between the determination region 110 and the determination region 120 is, e.g., a region which is equal to a distance $L_4$ and for which determination is not made. This region includes a boundary between the first function region 11 and the second function region 12.

The width of the determination region 130 is, e.g., equal to a distance $L_3$, as shown in FIG. 3A. The distance $L_3$ is, e.g., smaller than the width of the third function region 13, as shown in FIG. 29.

Between the determination region 120 and the determination region 130 is, e.g., a region which is equal to a distance $L_5$ and for which determination is not made. This region includes a boundary between the second function region 12 and the third function region 13.

The distances $L_1$ to $L_3$ in the present embodiment are equal as an example, but it is not limited thereto. In addition, the distances $L_4$ and $L_5$ are equal as an example, but it is not limited thereto.

The control unit 7 is provided with, e.g., the table 70, as shown in FIG. 2A. The table 70 associates, e.g., between the capacitance values $C_1$, $C_2$, the determination regions 110 to 130, and the first to third function regions 11 to 13. Based on the acquired capacitance values $C_1$, $C_2$ and the table 70, the control unit 7 determines the function region which includes the touch position of the operation finger 9.

The control unit 7 generates operation information S4 including information of an operating direction of the operation unit 2 and the function region, and outputs the operation information S4 to an operated object. As an example, the operated object is a window driving device which opens/closes a window. Based on the acquired operation information S4, the window driving device determines and executes the function corresponding to the operation direction and the operated position.

An example of an operation of the operation device 1 in the present embodiment will be described below in reference to the flowchart of FIG. 4. The operation from the detection of an operation to the output of the operation information S4 will be mainly described here, as an example.

(Operation)

When it is "Yes" in Step 1, i.e., when the switch signal S3 indicating that an operation is detected is input from the switch unit 6 (Step 1: Yes), the control unit 7 of the operation device 1 determines the function region based on the acquired capacitance values $C_1$, $C_2$ and the table 70 (Step 2).

When the function region is determined (Step 3: Yes), the control unit 7 outputs the operation information S4, which includes information of the operation direction and the determined function region, to the operated object (Step 4) and ends the process associated with the performed operation.

At this stage, if the function region is not determined in Step 3 (Step 3: No), the control unit 7 proceeds to Step 1.

Effects of the Embodiment

The operation device 1 in the present embodiment is configured that plural functions can be assigned to one operation unit 2 while suppressing an increase in size. In detail, in the operation device 1, one operation unit 2 having a width of about three operation fingers 9 or less is divided into three function regions and a different function is assigned to each function region. In addition, since the function region is determined based on the contact portion of the operation finger 9 on the operation unit 2, the operation device 1 only has the size of one operation unit 2 while having three different functions, unlike when aligning operation units each having a wider width than the operation finger. As such, it is possible to assign plural functions to one operation unit 2 while suppressing an increase in size of the operation device 1.

In the operation device 1, the detection unit 5 for detecting the touch position of the operation finger 9 on the operation unit 2 is provided on the side surface 32 and the side surface 33 of the recessed portion 3, i.e., can be avoided from being arranged on a movable member and thus can be easily arranged, unlike when providing on the operation unit. In addition, since the detection unit 5 is not arranged on a movable member in the operation device 1, it is possible to prevent troubles caused by wire breakage, etc.

The operation device 1 is configured that the instructed function can be easily determined based on the combination of the operation direction and the function region without providing a sensor for detecting the touch position on the operation unit 5.

As a modification, the operation device 1 may be configured that the detection unit 5 is arranged on, e.g., an imaginary plane 4c which is extended including a plane facing the front surface 24 of the operation unit 2, as shown in FIGS. 1B and 3B. As an example, the detection unit 5 in this case is a touch sensor having plural detection electrodes and plural drive electrodes arranged in a matrix pattern while being insulated from each other, and is configured to have a higher sensitivity so that the operation finger 9 coming into contact with the operation unit 2 is detected in the state of moving nearby in the air.

As another modification, the detection unit 5 may be arranged on the imaginary plane 4d defined by extending a plane facing the bottom surface 21 of the operation unit 2. The detection unit 5 in this case is configured to have a higher sensitivity so that the operation finger 9 coming into contact with the operation unit 2 is detected in the state of moving nearby in the air.

Although some embodiment and modifications of the invention have been described, the embodiment and modifications are merely an example and the invention according to claims is not to be limited thereto. The new embodiment and modifications may be implemented in various other forms, and various omissions, substitutions and changes, etc., can be made without departing from the gist of the invention. In addition, all combinations of the features described in the embodiment and modifications are not necessary to solve the problem of the invention. Further, the embodiment and modifications are included within the scope and gist of the invention and also within the invention described in the claims and the range of equivalency.

REFERENCE SIGNS LIST

1 OPERATION DEVICE
2 OPERATION UNIT
3 RECESSED PORTION
5 DETECTION UNIT
7 CONTROL UNIT
10 OPERATION FINGER
11 to 13 FIRST TO THIRD FUNCTION REGIONS
20 UPPER SURFACE
24 FRONT SURFACE
25 BACK SURFACE
27 ROTATIONAL AXIS
51 FIRST SENSOR
51a ELECTRODE
52 SECOND SENSOR
52a ELECTRODE

The invention claimed is:

1. An operation device, comprising:
   an operation unit to which a plurality of functions of an operated object are assigned corresponding to a position to be touched by an operation finger;
   a detection unit that is arranged on at least one plane extended including a plane facing the operation unit to detect the operation finger performing an operation on the operation unit; and
   a determination unit to determine an instructed function based on a combination of the operation performed on the operation unit and the touch position of the detected operation finger,
   wherein the detection unit is not disposed in the operation unit, and wherein the detection unit is configured such that the operation finger lies between the detection unit and the operation unit when the operation unit is touched by the operation finger.

2. The operation device according to claim 1, wherein the operation device comprises a recessed portion on a side of a front surface of the operation unit to receive the operation finger inserted therein at the time of performing an operation, and wherein the at least one plane including the plane facing the operation unit comprises a surface defining the recessed portion.

3. The operation device according to claim 1, wherein the operation unit is configured such that a push-down operation and a pull-up operation about a rotational axis can be performed thereon, and wherein the detection unit is arranged on a plane extended including a plane intersecting the rotational axis.

4. The operation device according to claim 1, wherein the operation unit is configured such that a push-down operation and a pull-up operation about a rotational axis can be performed thereon, and wherein the detection unit is arranged on a plane extended including a plane facing a front surface of the operation unit.

5. The operation device according to claim 3,
wherein the operation device comprises an operation detecting portion to detect the push-down operation and the pull-up operation performed on the operation unit,
wherein the detection unit comprises a first detection portion and a second detection portion that are arranged on the plane extended including the plane intersecting the rotational axis,
wherein the determination unit determines that to execute the function on a side of the first detection portion of the operation unit is instructed if the push-down operation or the pull-up operation is detected and a detection value of the first detection portion is larger than a detection value of the second detection portion, and
wherein the determination unit determines that to execute the function on a side of the second detection portion of the operation unit is instructed if the push-down operation or the pull-up operation is detected and the detection value of the second detection portion is larger than the detection value of the first detection portion.

6. The operation device according to claim 5, wherein the determination unit determines that to execute the function assigned to the middle of the operation unit is instructed if the push-down operation or the pull-up operation is detected and the detection value of the first detection portion and the detection value of the second detection portion are equal within a predetermined tolerance.

7. The operation device according to claim 5, wherein the determination unit makes no determination of the instructed function if the push-down operation or the pull-up operation is detected, the detection value of the first detection portion is larger than the detection value of the second detection portion and a difference between the two detection values is smaller than a predetermined value and is not within the tolerance, or if the push-down operation or the pull-up operation is detected, the detection value of the second detection portion is smaller than the detection value of the first detection portion and a difference between the two detection values is smaller than a predetermined value and is not within the tolerance.

8. The operation device according to claim 5, wherein each of the first and second detection portions comprises a capacitive sensor comprising a detection electrode formed using a plate-shaped conductive metal.

9. The operation device according to claim 5, wherein the operation unit comprises an identification portion on each upper surface of a region corresponding to the function assigned on the first detection portion side, a region corresponding to the function assigned to the middle of the operation unit, and a region corresponding to the function assigned on the second detection portion side, so as to identify each of the regions.

10. The operation device according to claim 9, wherein the identification portion comprises a raised portion or a recessed portion.

* * * * *